(12) United States Patent
Jeong et al.

(10) Patent No.: US 11,127,647 B2
(45) Date of Patent: Sep. 21, 2021

(54) SEMICONDUCTOR DEVICES AND RELATED METHODS

(71) Applicant: Amkor Technology Singapore Holding Pte. Ltd., Singapore (SG)

(72) Inventors: Jin Suk Jeong, Incheon (KR); Min Jae Kong, Seoul (KR); Hyun Hye Jung, Incheon (KR)

(73) Assignee: Amkor Technology Singapore Holding PTE. LTD, Singapore (SG)

(\*) Notice: Subject to any disclaimer, the term of this patent is extended or adjusted under 35 U.S.C. 154(b) by 0 days.

(21) Appl. No.: 16/702,854

(22) Filed: Dec. 4, 2019

(65) Prior Publication Data

US 2021/0175140 A1 Jun. 10, 2021

(51) Int. Cl.
*H01L 23/31* (2006.01)
*H01L 21/56* (2006.01)
*H01L 23/552* (2006.01)
*H01L 25/00* (2006.01)

(52) U.S. Cl.
CPC ........ *H01L 23/3128* (2013.01); *H01L 21/561* (2013.01); *H01L 21/568* (2013.01); *H01L 23/552* (2013.01); *H01L 25/00* (2013.01)

(58) Field of Classification Search
CPC .. H01L 23/3128; H01L 21/561; H01L 21/568
See application file for complete search history.

(56) References Cited

U.S. PATENT DOCUMENTS

2018/0197821 A1\* 7/2018 Shin .................... H01L 23/3128

\* cited by examiner

*Primary Examiner* — Errol V Fernandes
(74) *Attorney, Agent, or Firm* — Spectrum IP Law Group LLC

(57) ABSTRACT

In one example, a semiconductor device, comprising a substrate having a top side and a bottom side, an electronic device on the top side of the substrate, a first encapsulant on the top side of the substrate contacting a side of the electronic device, a second encapsulant on the bottom side of the substrate, wherein the second encapsulant includes an undercut at an end of the second encapsulant, and a cover layer comprising a top cover on a top side of the first encapsulant and a side cover on a side of the first encapsulant and a side of the substrate, wherein the side cover extends adjacent to the undercut. Other examples and related methods are also disclosed herein.

20 Claims, 18 Drawing Sheets

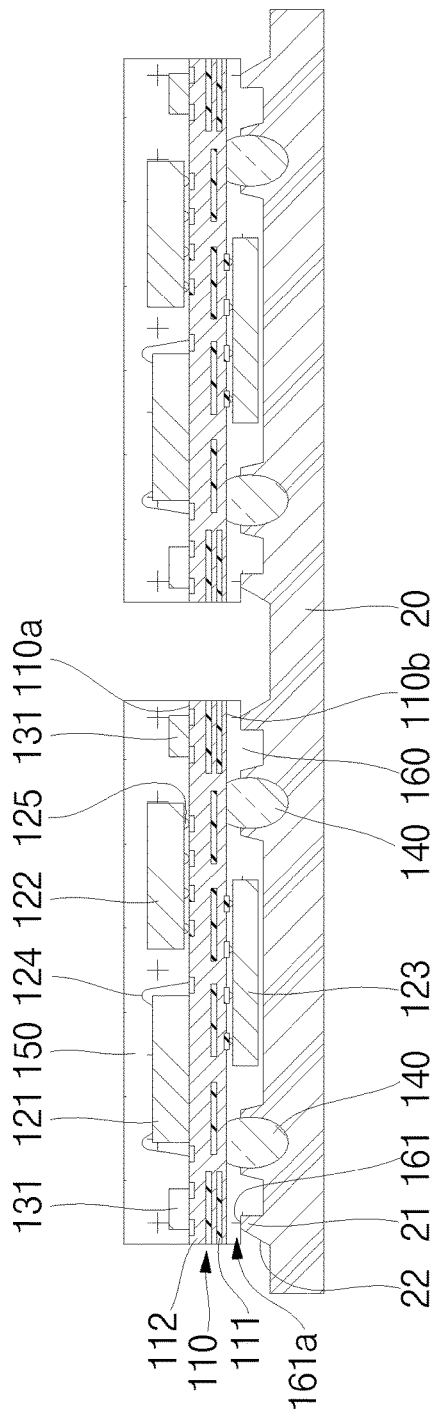
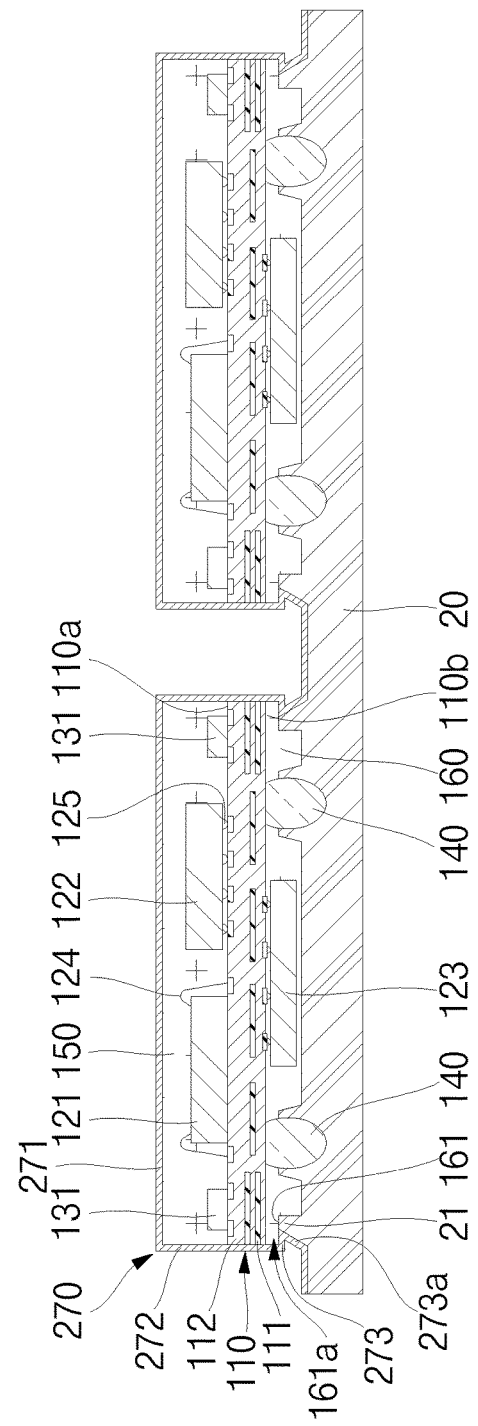
FIG. 4A
FIG. 4B

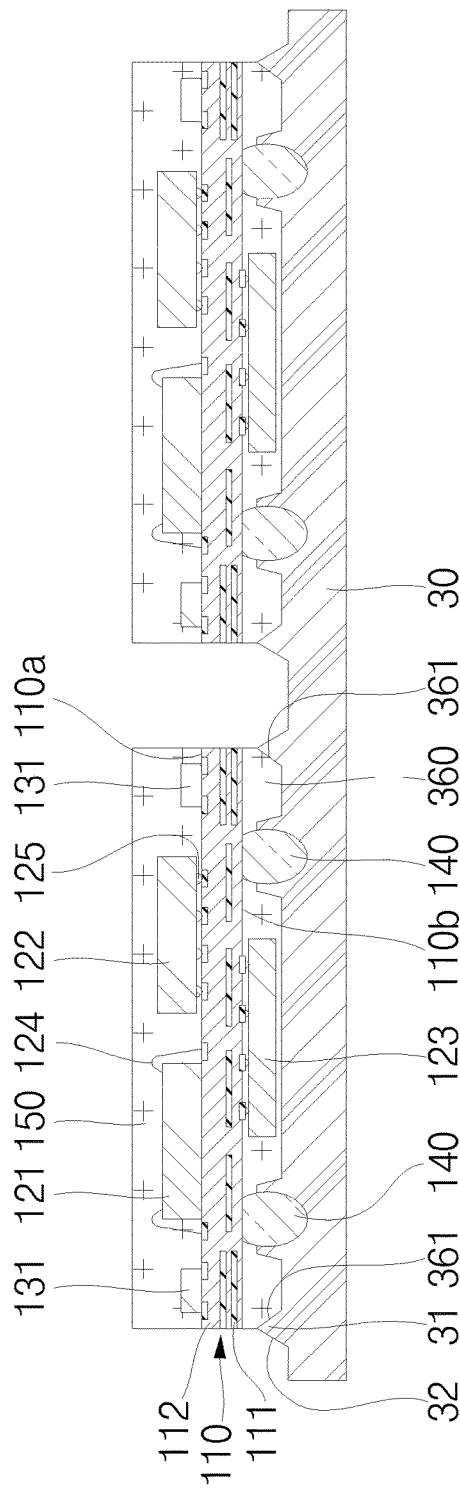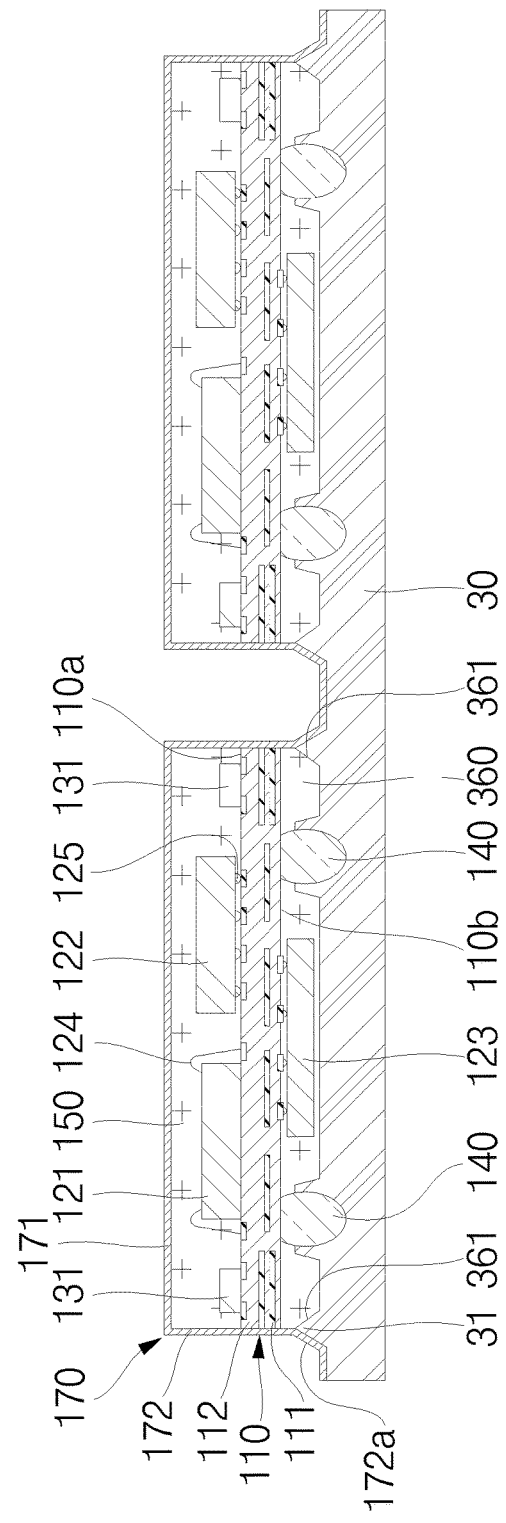

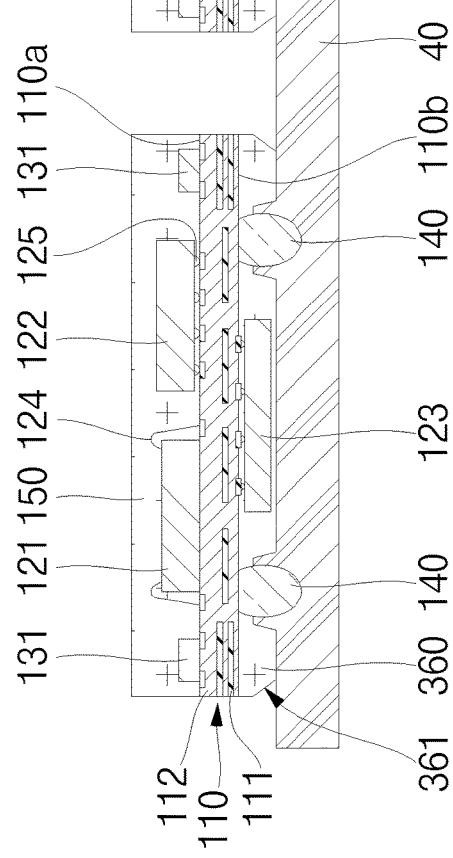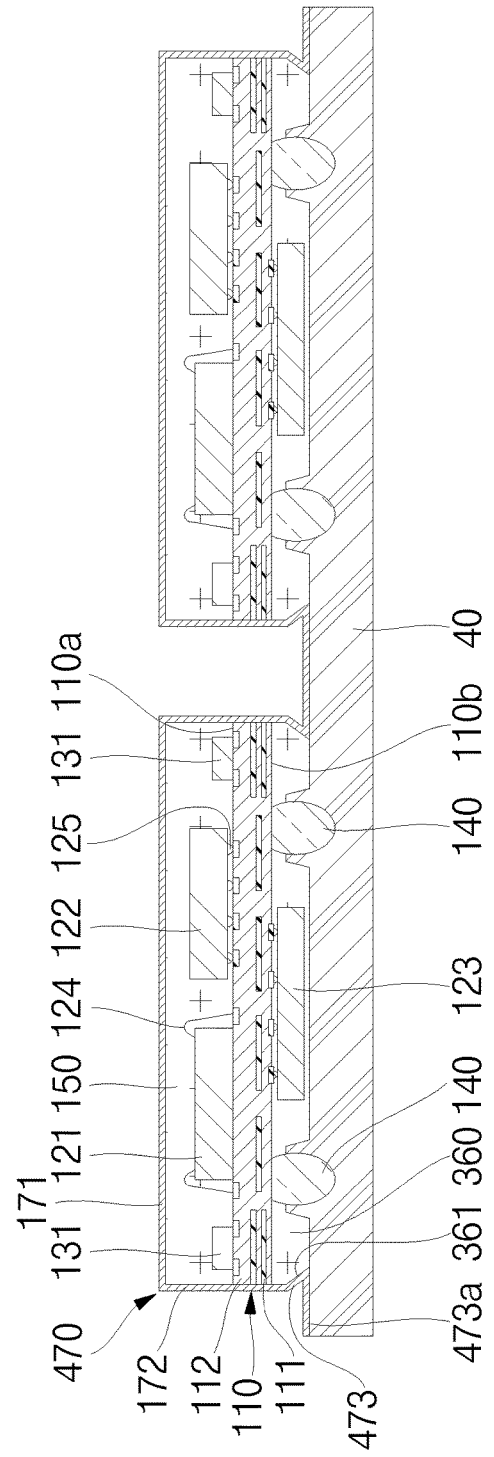
FIG.8A
FIG.8B

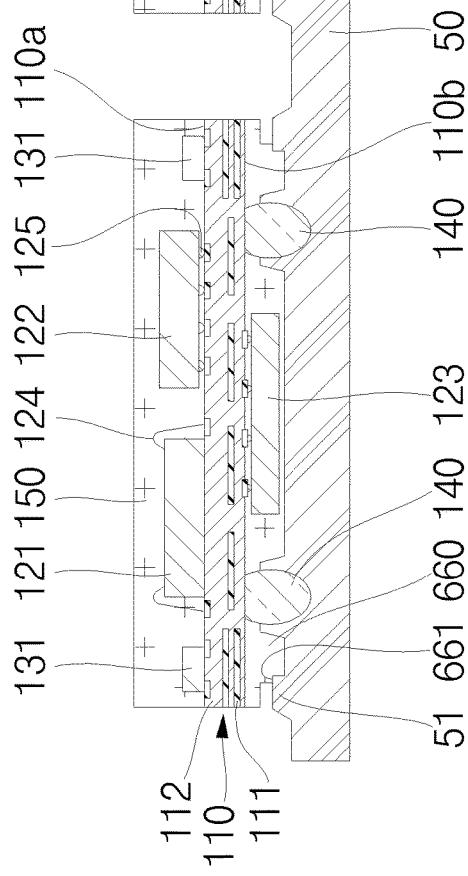
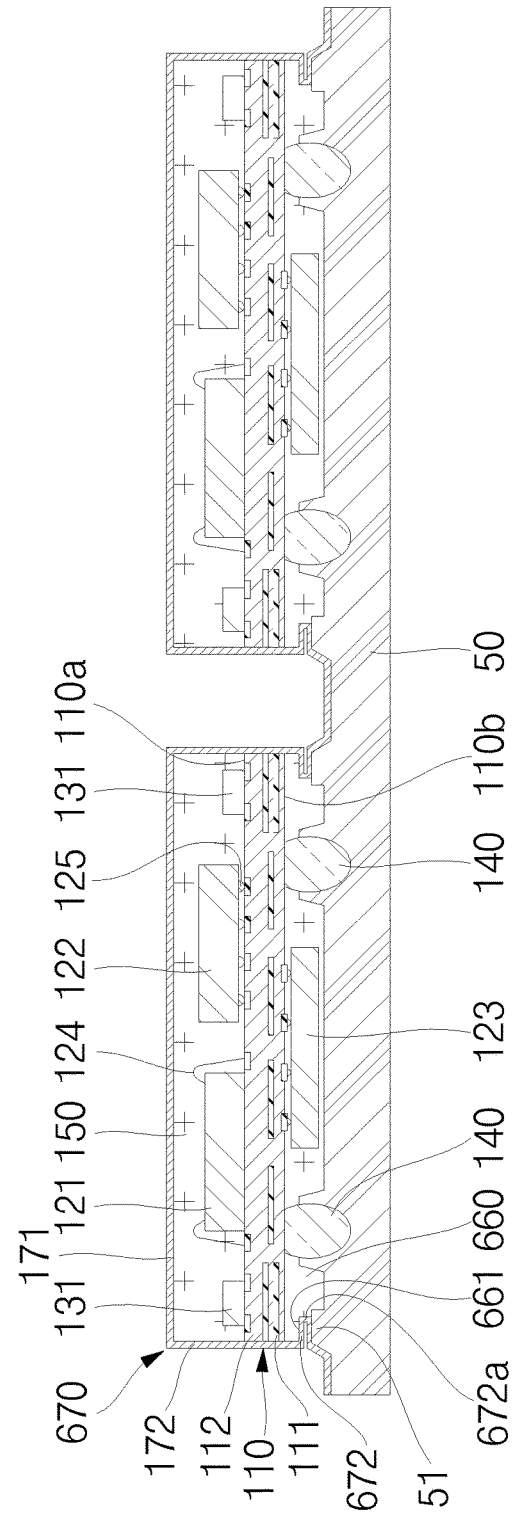

SEMICONDUCTOR DEVICES AND RELATED METHODS

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 4A to 4C show an example method for manufacturing an example semiconductor device.

FIGS. 6A to 6C show an example method for manufacturing an example semiconductor device.

FIGS. 8A to 8C show cross-sectional views of an example method for manufacturing an example semiconductor device.

FIGS. 11A to 11C show cross-sectional views of an example method for manufacturing an example semiconductor device.

Figure 1:
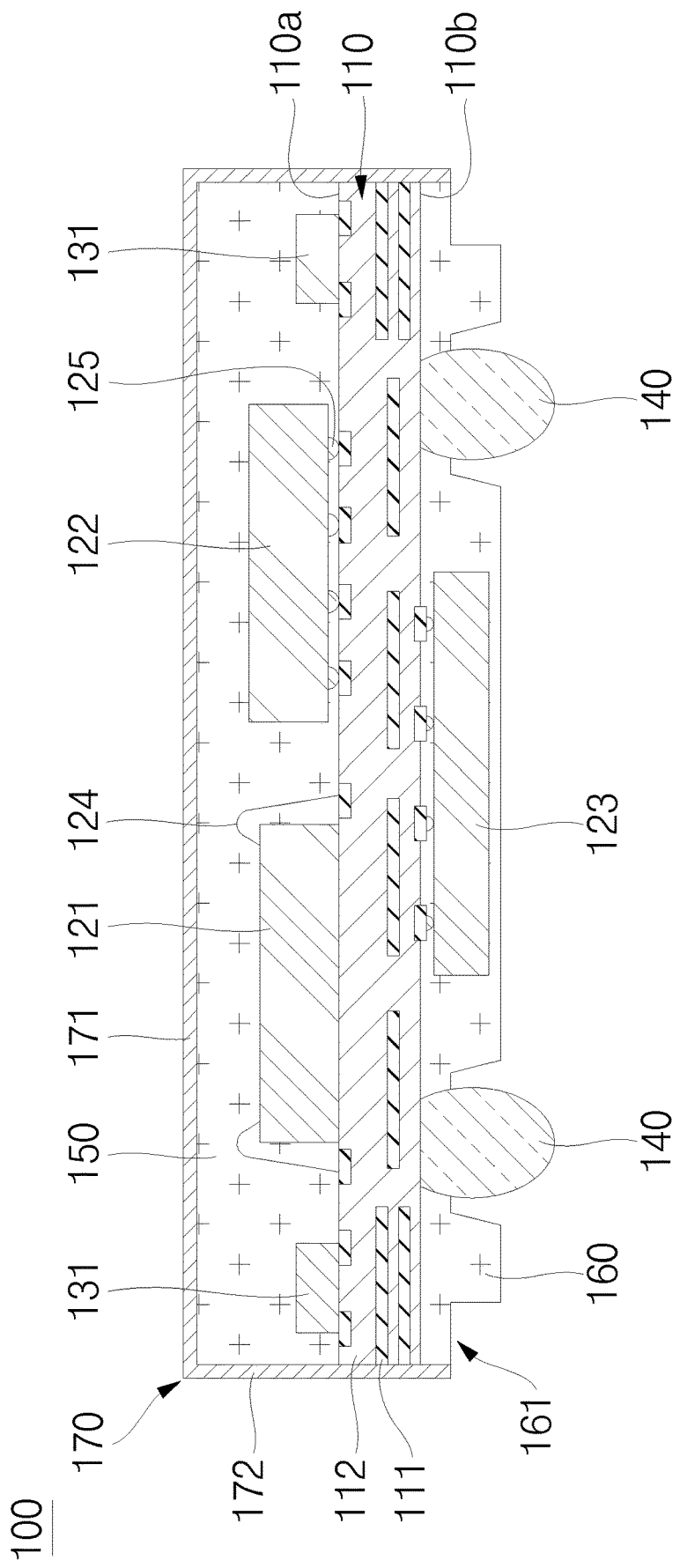
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The terms "and/or" include any single item, or any combination of the items, in the list joined by "and/or". As used in this disclosure, the singular forms are intended to include the plural forms as well, unless the context clearly indicates otherwise. The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In a first example, a semiconductor device comprises a substrate having a top side and a bottom side, an electronic device on the top side of the substrate, a first encapsulant on the top side of the substrate contacting a side of the electronic device, a second encapsulant on the bottom side of the substrate, wherein the second encapsulant includes an undercut at an end of the second encapsulant, and a cover layer comprising a top cover on a top side of the first encapsulant and a side cover on a side of the first encapsulant and a side of the substrate, wherein the side cover extends adjacent to the undercut.

In a second example, a method to manufacture a semiconductor device comprises providing a substrate having a top side and a bottom side, providing a first electronic device on the top side of the substrate and a second electronic device on the bottom side of the substrate, providing a first encapsulant on the top side of the substrate contacting a side of the first electronic device, and a second encapsulant on the bottom side of the substrate contacting a side of the second electronic device, providing an undercut at an end of the second encapsulant, attaching a carrier to a bottom side of the second encapsulant, providing a cover layer on a top side of the first encapsulant, on a side of the first encapsulant, on a side of the substrate, and on a portion of the carrier, and removing the carrier and a portion of the cover layer on the portion of the carrier, wherein the cover layer remains adjacent to the undercut after the removing.

In yet another example, a semiconductor device comprises a substrate having a top side and a bottom side, an electronic device on the top side of the substrate, a first encapsulant portion on the top side of the substrate and a second encapsulant portion on the bottom side of the substrate, wherein the first encapsulant portion contacts a side of the electronic device, an undercut in the second encapsulant portion; and a shield on a top side of the first encapsulant portion, on a lateral side of the second encapsulant portion, and extending adjacent to the undercut.

Other examples are included in the present disclosure. Such examples may be found in the figures, in the claims, and/or in the description of the present disclosure.

FIG. 1 shows a cross-sectional view of an example semiconductor device 100. In the example shown in FIG. 1, semiconductor device 100 can comprise a substrate 110, electronic devices 121, 122, 123, and 131, interconnects 124 and 125, external interconnects 140, encapsulants 150 and 160, and cover layer 170.

Substrate 110 can comprise conductive structure 111 and dielectric structure 112. Encapsulant 160 can comprise undercut 161. Substrate 110, external interconnects 140, encapsulant 150, and encapsulant 160 can be referred to as semiconductor package or package, and can protect electronic devices 121, 122, 123, and 131 from external elements and/or environmental exposure. In addition, semiconductor package can provide electrical connection between each of external components and electronic devices 121, 122, and 123, and 131. In some examples, encapsulant 150 can contact a side of electronic device 121, electronic device 122, or electronic device 131, and encapsulant 160 can contact a side of electronic device 123. In some examples, encapsulant 150 and encapsulant 160 can comprise two portions of the same encapsulant, for example formed by a single encapsulating or molding process. In some examples, encapsulant 150 and encapsulant 160 can comprise separate portions of different encapsulants, for example formed by multiple encapsulating or molding processes. In some examples, semiconductor device 100 can comprise a substrate having top side or surface 110a and a bottom side or surface 110b, an electronic device 121, electronic device 122, or electronic device 131 on the top side or surface 110a of substrate 110. Semiconductor device 100 can have a first encapsulant 150 on the top side or surface 110a of substrate 110 contacting a side of electronic device 121, 122, or 131, and a second encapsulant 160 on the bottom side or surface 110b of substrate 110, wherein the second encapsulant 160 includes an undercut 161 at an end of the second encapsulant. Semiconductor device 100 can include a cover layer 170 comprising a top cover 171 on a top side of the first encapsulant 160 and a side cover 172 on a side of the first encapsulant 160 and a side of the substrate, wherein the side cover extends adjacent to the undercut.

Figure 2A:
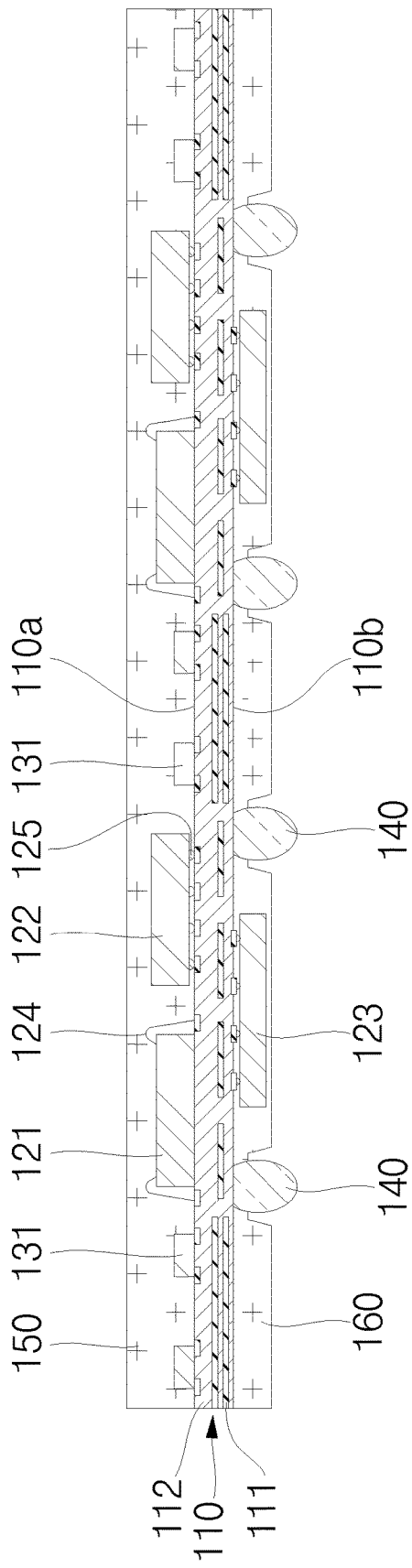
FIGS. 2A to 2F show an example method for manufacturing an example semiconductor device.

FIGS. 2A to 2F show an example method for manufacturing an example semiconductor device such as semiconductor device 100. FIG. 2A shows a cross sectional view of semiconductor device 100 at an early stage of manufacture. In the example shown in FIG. 2A, a strip or array of semiconductor devices can be provided, having encapsulants 150 and 160 formed or provided or provided on surface 110a and surface 110b of a substrate 110, where electronic devices 121, 122 and 131 are mounted on surface 110a of substrate 110, and where electronic device 123 is mounted on surface 110b of substrate 110. In addition, external interconnects 140 can be electrically connected to surface 110b of substrate 110.

Substrate 110 can comprise conductive structure 111 and dielectric structure 112. Conductive structure 111 can comprise conductors such as pads, traces or vias that extend on, between, or through one or more dielectric layers of dielectric structure 112. Substrate 110 can have electronic devices 121, 122, 123 and 131 mounted on surface 110a or surface 110b. Substrate 110 can allow electrical signals to be input to or output from electronic devices 121, 122, 123, or 131 and external interconnects 140 through conductive structure 111.

Electronic devices 121, 122, 123, or 131 can be attached to surface 110a of substrate 110. In some examples, electronic device 123 can be attached to surface 110b of substrate 110. In some examples, electronic devices 121, 122, 123, or 131 can comprise semiconductor dies or chips. Electronic devices 121, 122, 123, or 131 can comprise active or passive elements. In some examples, active elements can comprise an application specific integrated circuit, a logic circuit, a microcontroller unit, a memory, a digital signal processor, an analog to digital converter, a network processor, a power management unit, an audio processor, a radio-frequency (RF) circuit, or a wireless baseband system on chip processor. In some examples, passive elements can comprise a capacitor, a resistor, an inductor, or a light-emitting diode (LED).

Electronic devices 121, 122, 123 and 131 can be electrically coupled to a surface of substrate 110 through interconnects 124 or 125. In some examples, interconnects 124 or 125 can comprise or be referred to as conductive wires, conductive bumps, or conductive pillars. Interconnects 124 or 125 can be coupled to electrodes or terminals of electronic devices 121, 122, 123, or 131. In some examples, when terminals of electronic device 121 face away from substrate 110, interconnects 124 can comprise wires or wirebonds between such terminals to substrate 110. In some examples, when terminals of electronic device 122 faces towards from substrate 110, interconnects 125 can comprise conductive bumps or pillars between such terminals and substrate 110.

External interconnects 140 can be coupled to surface 110b of substrate 110. In some examples, external interconnects 140 can comprise solder balls, stacked solder balls, metallic pillars, or a combination thereof. External interconnects 140 can be electrically connected to electronic devices 121, 122, 123, or 131 through substrate 110.

In an example, encapsulants 150 and 160 can be formed or provided on surface 110a or surface 110b of substrate 110. Encapsulants 150 and 160 can encapsulate components coupled to substrate 110 for protection. Encapsulants 150 and 160 can comprise a dielectric material, such as a resin or a mold compound. In some examples, encapsulant 150 can be formed or provided while filling gaps between electronic devices 121, 122, and 131 on surface 110a of substrate 110 and interconnects 124 and 125. In some examples, encapsulant 160 can cover electronic device 123 on surface 110b of substrate 110.

Figure 2B:
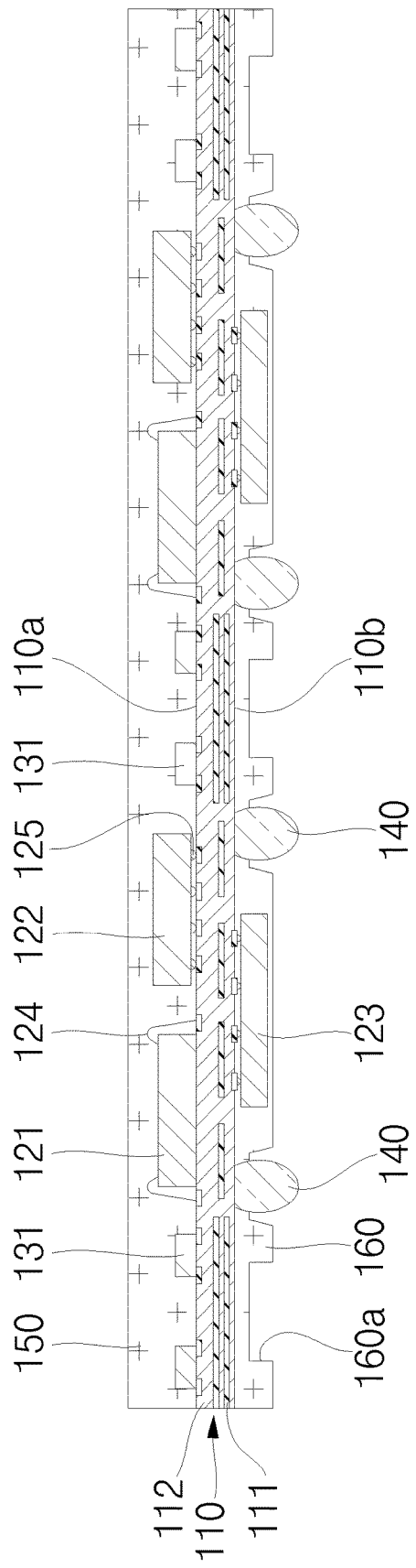

In the example shown in FIG. 2B, some regions 160a of encapsulant 160 can be removed. Such regions 160a can be removed by half etching or partially etching through the bottom surface of encapsulant 160. In some examples, regions 160a can be removed by partially ablating the bottom surface of encapsulant 160, such as by partial sawing or lasering. Removed regions 160a can be located to correspond to or define undercuts 161 of encapsulant 160. In some examples, substrate 110 can be provided having a top side or surface 110a and a bottom side or surface 110b. A first electronic device 121, 122, or 131 can be provided on the top side of substrate 110. A first encapsulant 150 can provided on the top side of substrate 110 contacting a side of electronic device 121, 122, or 131. A second encapsulant 160 can be provided on a bottom side or surface 110b of substrate 110.

Figure 2C:
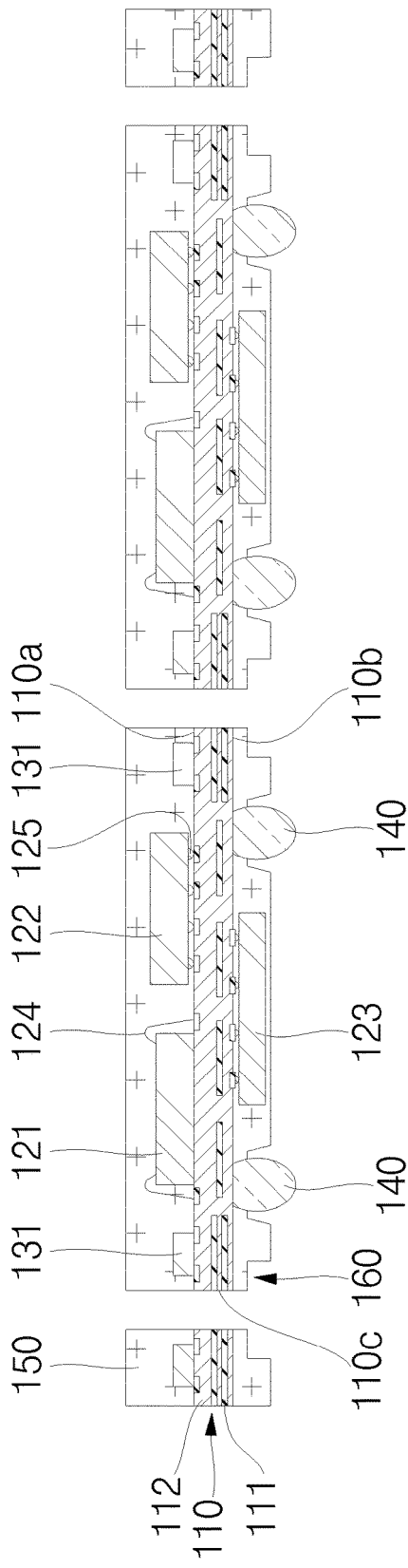

In the example shown in FIG. 2C, the strip or array including substrate 110 and encapsulants 150 and 160 can be singulated into discrete semiconductor devices. In some examples, singulation can be referred as sawing and can be performed using a diamond blade or a laser beam. In addition, conductors of conductive structures 111 within substrate 110 can be exposed at side surfaces 110c of substrate 110 resulting from singulation.

Figure 2D:
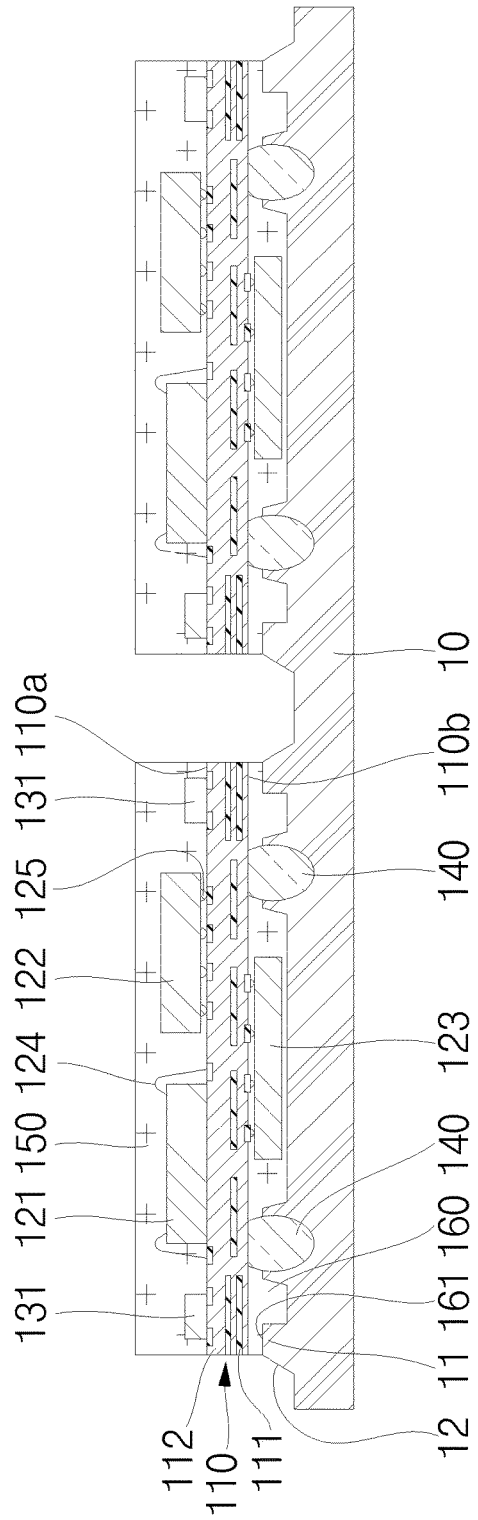

In the example shown in FIG. 2D, bottom portions of singulated semiconductor devices 100 can be coupled to carrier 10. In some examples, carrier 10 can comprise an adhesive material that is soft or pliable such as epoxy or silicone. In some examples, carrier 10 can have a thickness of 20 μm or greater. Singulated semiconductor devices 100 can be pressed or dipped into the adhesive of carrier 10 until the adhesive reaches undercuts 161 of encapsulant 160 but can stop before the adhesive extends onto the side surfaces of encapsulant 160 or of substrate 110. Accordingly, individual semiconductor devices 100 mounted on top portion 11 of carrier 10 can be fixed on carrier 10. In some examples, carrier 10 can have a fillet 12 extending at an angle from a side of substrate 10 to a top side of carrier. In some examples, fillet 12 can be outwardly slanted adjacent to undercut 161. As shown in and described with respect to FIG. 2E, below, fillet 12 can be covered by a carrier cover 172a portion of cover layer 170 when cover layer 170 is provided. Undercut 161 can be provided at an end of the second encapsulant 160, and carrier 10 can be attached to a bottom side or surface 110b of substrate 110.

Figure 2E:
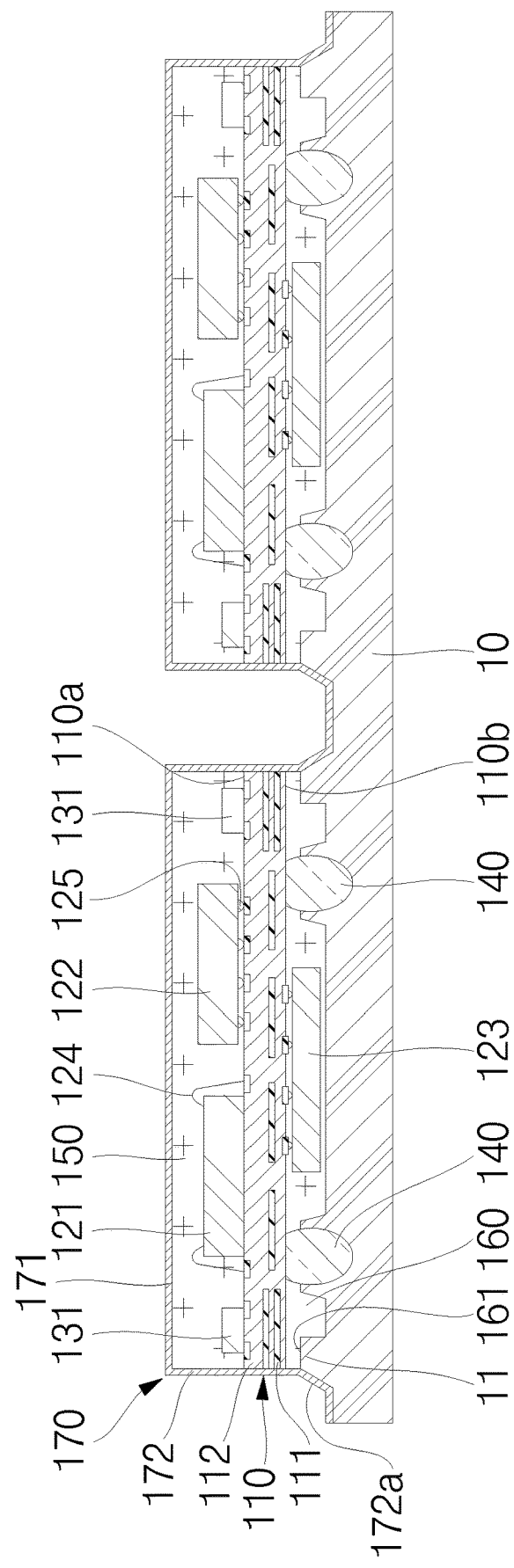

In the example shown in FIG. 2E, cover layer 170 can be formed or provided on a top side of the first encapsulant 160, on a side of substrate 110, and on a portion of carrier 10. Cover layer 170 can be made of one or more layers of metallic material that can conform to contours of exposed portions of carrier 10 and portions of semiconductor device 100 that are exposed from carrier 10. In some examples, cover layer 170 can be electrically connected to or can conform to exposed ground conductors of conductive structure 111 that are exposed at side surface 110c or at top surface 110a of substrate 110, to provide an electromagnetic interference (EMI) shielding effect. In some examples, cover layer 170 can be formed or provided on five surfaces of semiconductor device 100, for example, top surface and four side surfaces, and on some portions of encapsulant 160. In some examples, cover layer can comprise a shield. Cover layer 170 can cover most of the exposed regions of semiconductor device 100 to protect internal components of semiconductor device 100 from external electromagnetic interference. Cover layer 170 can comprise top cover 171 and side covers 172. Top cover 171 can cover a top surface of encapsulant 150 positioned on semiconductor device 100, and side covers 172 connected to top cover 171 can cover four side surfaces of encapsulant 150.

In some examples, cover layer 170 can have carrier cover 172a, or carrier cover portion, covering a surface of top portion 11 of carrier 10. Carrier cover 172a can connect portions of cover layer 170 on semiconductor devices 100 and on a surface of carrier 10. In some examples, cover layer 170 cover outer surfaces of encapsulant 150 and substrate 110 and can cover side surfaces of encapsulant 160 above undercuts 161. Cover layer 170 can thus entirely cover side surface 110c of substrate 110 above undercuts 161, to provide a shielding effect across the entire thickness of substrate 110. In addition, cover layer 170 can be formed or provided to entirely cover consecutive semiconductor devices 100. In some examples, cover layer 170 can be formed or provided using a plating process, such as electroplating or electroless plating, a spraying process, a sputtering process, or a deposition process. In some examples, cover layer 170 can cover not only substrate 110 but also the side surface of second encapsulant 160 exposed from substrate 110.

Figure 2F:
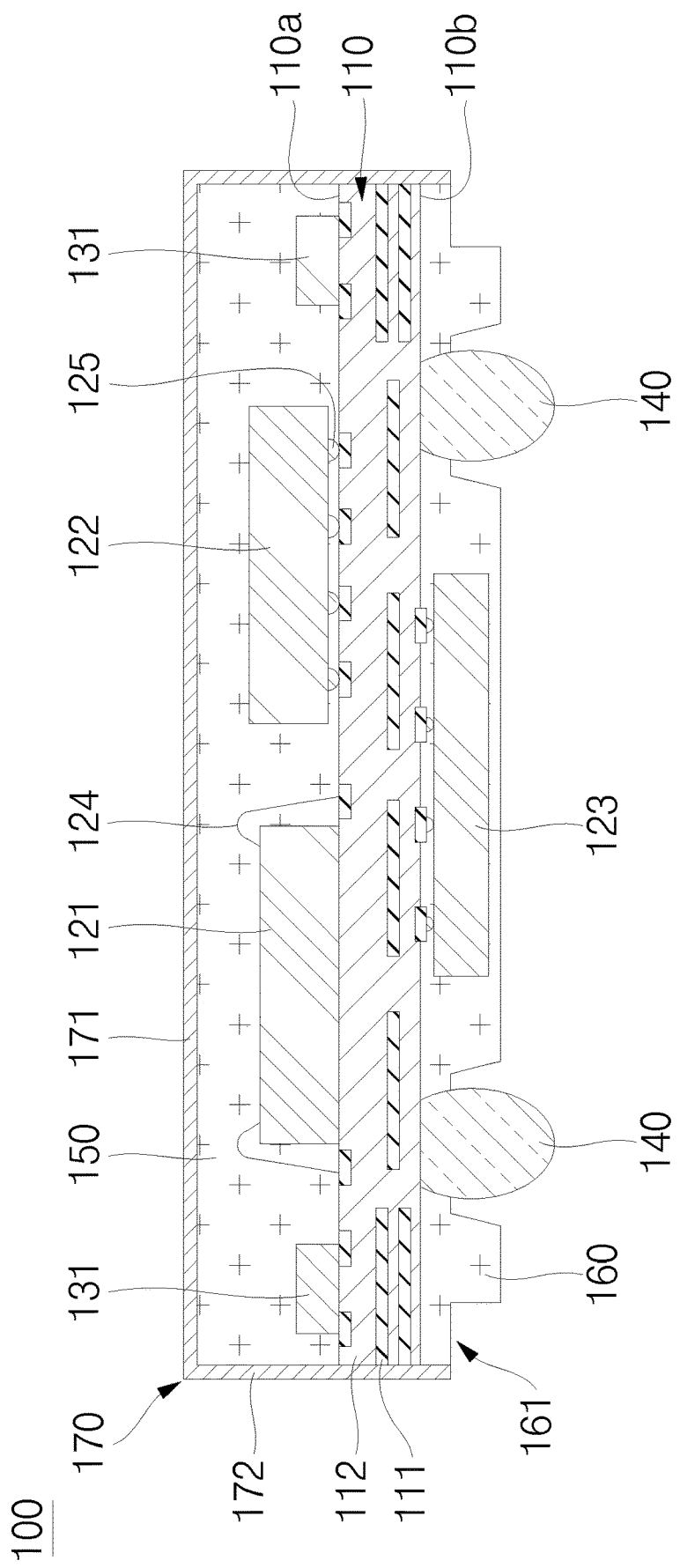

Referring to FIGS. 2E-2F in combination, singulated semiconductor devices 100 can be separated from carrier 10. In some examples, such separation can comprise a vertical lifting of semiconductor devices 100 from carrier 10, such as by pick and place equipment. In some examples, carrier 10 can be removed along with a portion of cover layer 170 on a portion of carrier 10 that includes cover layer 170. The cover layer 170, such as a side cover 172 can remain adjacent to undercut 161 after removing carrier 10. In the present example, semiconductor device 100 is separated such that carrier cover 172a breaks off from the rest of cover layer 170 cleanly along undercut 161 and remains on carrier 10. The presence of undercut 161 can permit space for the adhesive of carrier 10 to accumulate and not reach or cover part of the side surfaces of substrate 110 or of encapsulant 160. Accordingly, side cover 172 of cover layer 170 can be formed or provided to maximally or fully cover such side surfaces of substrate 110 or of encapsulant 160. The presence of undercut 161 can permit space for the adhesive of carrier 10 to form a fillet 12 that does not cover, or that is vertical or diagonal relative to, the side surfaces of substrate 110 or of encapsulant 160. In some examples, such fillet 12 formed or provided by the adhesive of carrier 10 can permit cover layer 170 to be formed or provided with a vertical or diagonal interface, rather than an orthogonal interface, between carrier cover 172a and side cover 172 of cover layer 170. In some examples, the fillet 12 can prevent an orthogonal interface that could otherwise form between carrier cover 172a and side cover 172 of cover layer 170. In some examples, the vertical or diagonal interface can achieve a consistent breakage or separation line between carrier cover 172a and side cover 172 when semiconductor device 100 is removed from carrier 10. In some examples, such consistent breakage or separation pattern can restrict burrs or sections of carrier cover 172a from remaining attached to or hanging from semiconductor device 100 after removal from carrier 10. In some examples, such consistent breakage or separation pattern can restrict peeling of lower sections of side cover 172 along the side surfaces of substrate 110 or encapsulant 160 when semiconductor device 100 is removed from carrier 10. Such burrs and peeling patterns can result from orthogonal interfaces, can thus be restricted by the vertical or diagonal interfaces afforded by undercut 161. In some examples, as shown in FIG. 2F, side cover 172 can cover a side of encapsulant 150 and can extend to be adjacent undercut 161. In some examples, semiconductor device 100 can comprise substrate 110 having a top side or surface 110a and a bottom side or surface 110b, electronic device 121, electronic device 122, or electronic device 131 on the top side or surface 110a of substrate 110. Semiconductor device 100 can have a first encapsulant portion 150 on surface 110a of substrate 110 and a second encapsulant portion 160 on the bottom side or surface 110b of substrate 110, wherein the first encapsulant portion 150 contacts a side of the electronic device 121, 122, or 131. The second encapsulant portion 160 can have an undercut 161, and semiconductor device 100 can have a shield 170 on a top side or surface 110a off first encapsulant portion 150, on a lateral side of the second encapsulant portion 160 and extending adjacent to undercut 161.

Figure 3:
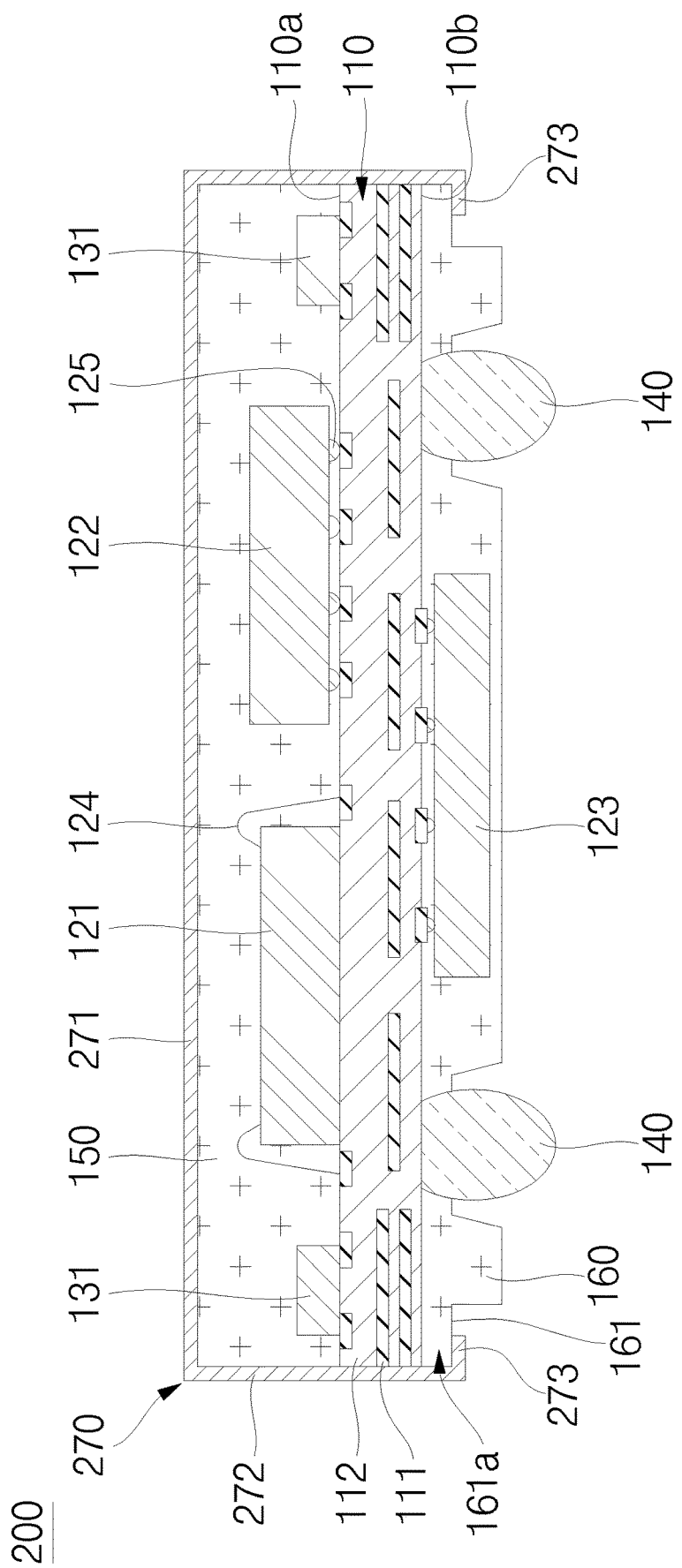
FIG. 3 shows a cross-sectional view of an example semiconductor device.

FIG. 3 shows a cross-sectional view of an example semiconductor device 200. Semiconductor device 200 can be similar to any other of the semiconductor devices described here, such as semiconductor device 100, but comprises cover layer 270 having side cover 272 including undercut cover 273. In some examples, as shown in FIG. 3, side cover 272 can contact a side of encapsulant 150 or encapsulant 160. Undercut 161 can comprise a horizontal ledge that is parallel with a bottom surface of substrate 110 and undercut cover 273 of side cover 272 can extend over undercut edge 161a wherein undercut cover 273 covers a portion of the horizontal ledge.

Figure 4C:
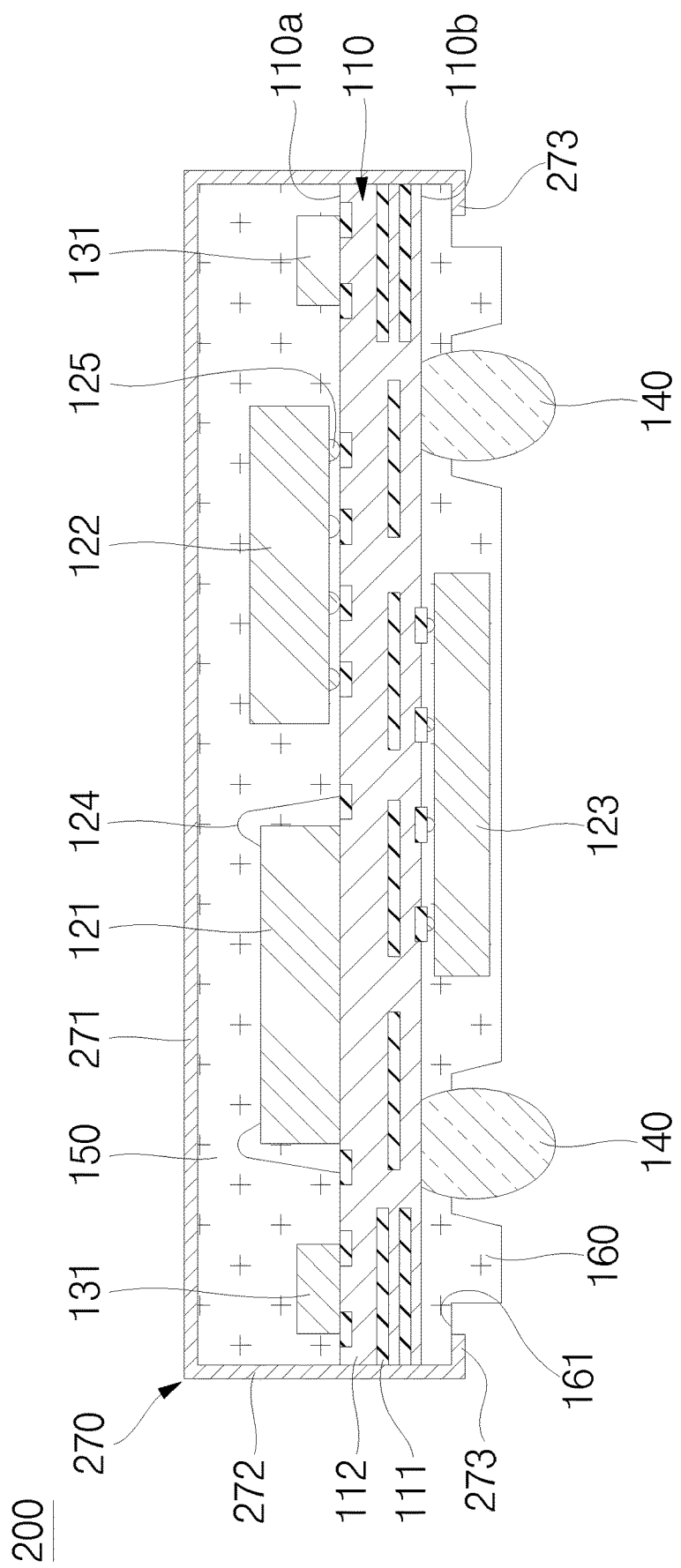

FIGS. 4A to 4C show an example method for manufacturing an example semiconductor device such as semiconductor device 200. FIG. 4A shows a cross sectional view of an early stage of manufacture for semiconductor device 200. The example and elements of FIG. 4A can be similar to those described above with respect to FIG. 2D. In the present example, carrier 20 can comprise an adhesive, and semiconductor devices 200 can be attached to the adhesive of carrier 20. Carrier 20 can be similar or the same as carrier 10, but when semiconductor devices 200 are attached, the fillet of the adhesive of carrier 20 does not fully fill undercut 161 and instead leaves undercut edge 161a exposed. In some examples, the fillet can fully cover undercut 161. In some examples, undercut edge 161a comprises a portion of a bottom facing surface of undercut 161. In some examples, fillet 22 can be provided on a top side of carrier 20 that covers a portion of undercut edge 161a but leaves a portion of undercut edge 161a exposed.

In the example shown in FIGS. 4B-4C, cover layer 270 can be formed or provided over semiconductor devices 200. Cover layer 270 can be similar to cover layer 170 described above, but further comprises undercut cover 273 that covers undercut edge 161a exposed by the adhesive of carrier 20. Cover layer 270 also comprises carrier cover 273a, similar to carrier cover 172a but having an interface with undercut cover 273 rather than with side cover 172. In some examples, such interface can be diagonal. In some examples, when carrier cover 273a and undercut cover 273 are separated while semiconductor device 200 is removed from carrier 20, such interface can provide benefits similar to those described above for achieving consistent breakage or separation.

Figure 5:
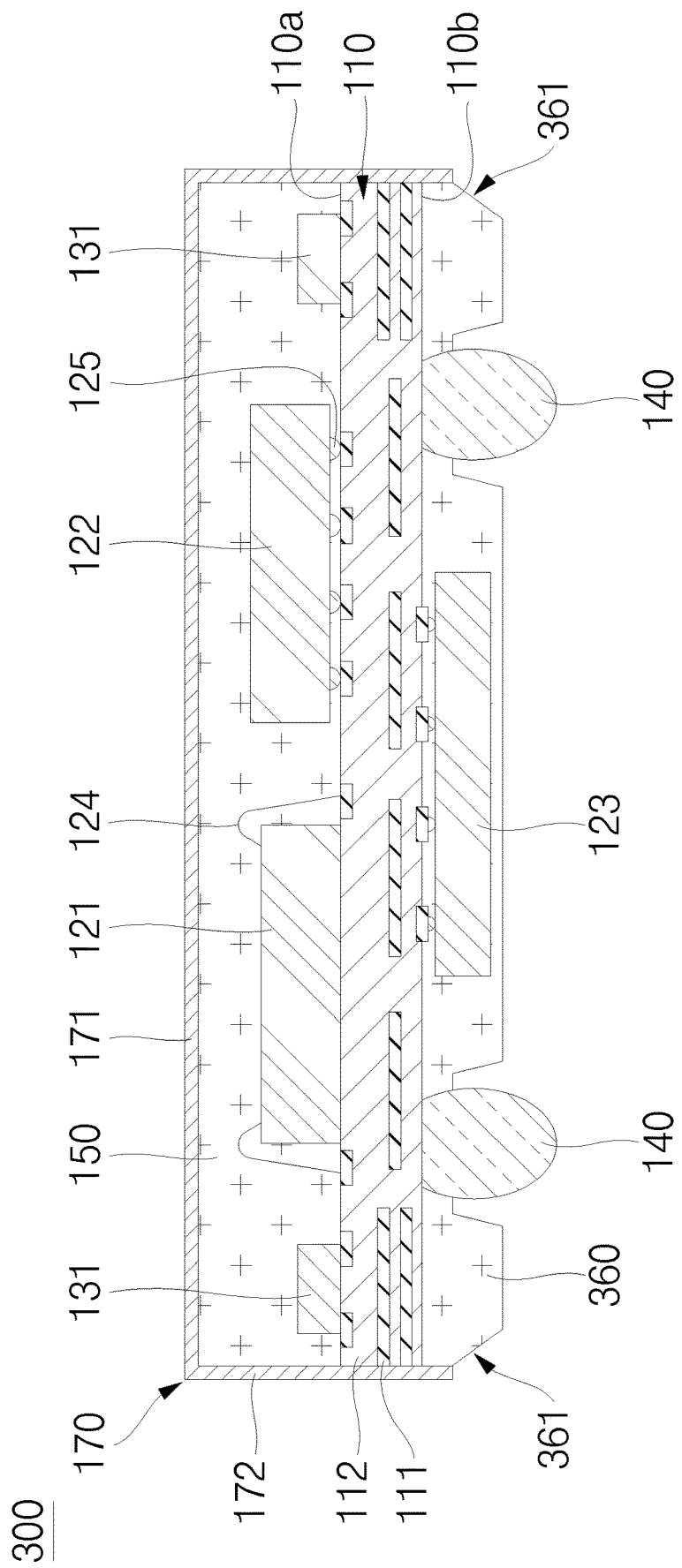
FIG. 5 shows a cross-sectional view of an example semiconductor device.

FIG. 5 shows a cross-sectional view of an example semiconductor device 300. Semiconductor device 300 can be similar to any other of the semiconductor devices described here, such as semiconductor device 100, but comprises encapsulant 360 having undercut 361. In some examples, as shown in FIG. 5, undercut 361 can comprise an angled or angular ledge that is slanted with respect to a bottom surface of substrate 110. In some examples, undercut 361 can comprise an angled or angular ledge that is at an acute angle with respect to a bottom surface of substrate 110.

Figure 6C:
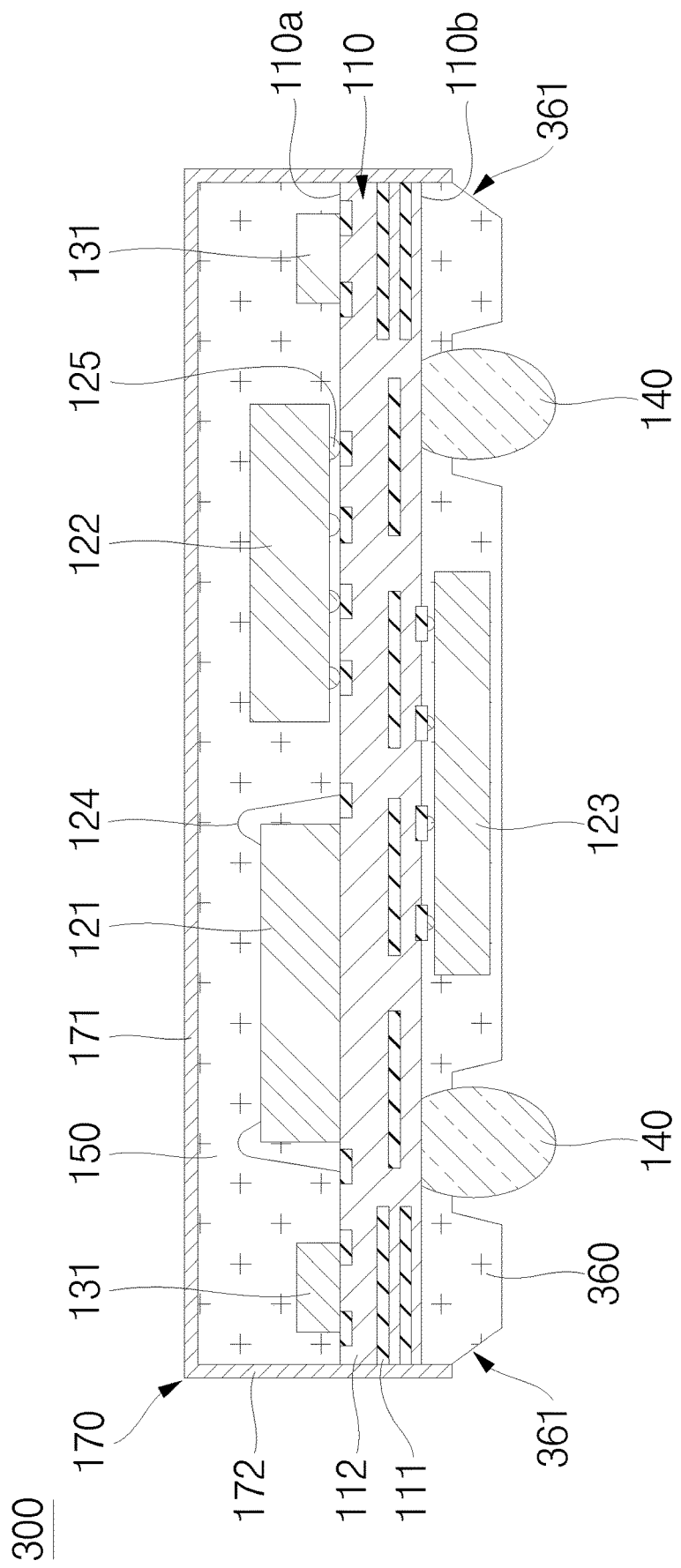

FIGS. 6A to 6C show an example method for manufacturing an example semiconductor device such as semiconductor device 300. FIG. 6A shows a cross sectional view of an early stage of manufacture for semiconductor device 300. The example and elements of FIG. 6A can be similar to those described above with respect to FIG. 2D. Encapsulant 360 at surface 110b of substrate 110 comprises undercut 361 having an inclined, angled, or diagonal main surface. This can contrast with the square or orthogonal surfaces that define undercut 161 of semiconductor device 100 described above. Although inclined, the main surface of undercut 361 can still be regarded as a bottom-facing surface. In some examples, the inclined main surface of undercut 361 can be formed or provided by etching, lasering, angled sawing, or grinding. Carrier 30 can comprise an adhesive, and semiconductor devices 300 can be attached to the adhesive of carrier 30. Carrier 30 can be similar or the same as carrier 10, but when semiconductor devices 300 are attached, the fillet 32 of the adhesive of carrier 30 can substantially or fully cover instead the inclined main surface of undercut 361, without covering the side surface of substrate 110, or without covering the side surface of encapsulant 360.

In the example shown in FIGS. 6B-6C, cover layer 170 can be formed or provided as described above with respect to FIG. 2E but here over semiconductor devices 300, and semiconductor device 300 can then be separated from carrier 30. Cover layer 170 can cover the top and side surfaces of encapsulant 150 and the side surfaces of substrate 110 and can cover the side surface of encapsulant 360. Cover layer 170 comprises the vertical or diagonal interface between carrier cover 172a and side cover 172 described above for permitting consistent breakage or separation line when semiconductor device 300 is removed from carrier 30.

Figure 7:
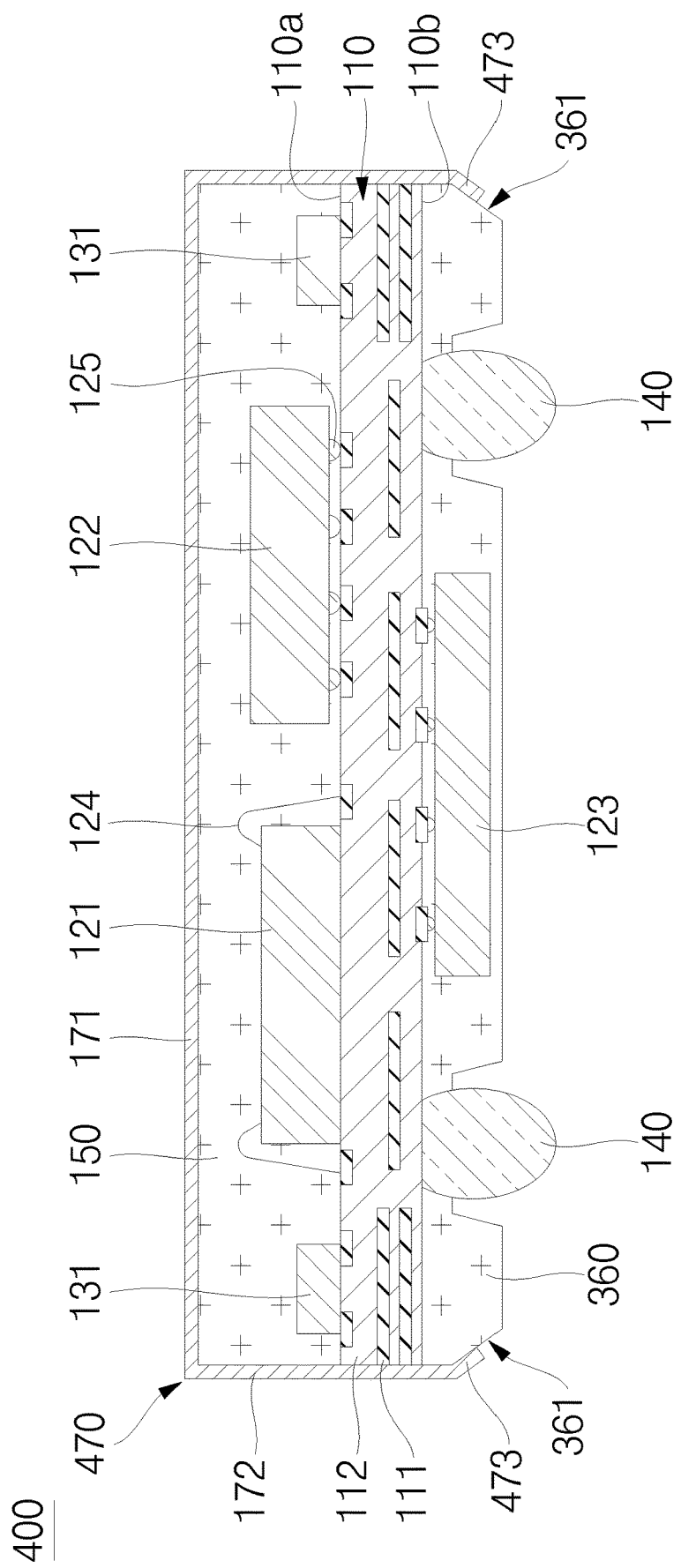
FIG. 7 shows a cross-sectional view of an example semiconductor device.

FIG. 7 shows a cross-sectional view of an example semiconductor device 400. Semiconductor device 400 can be similar to any other of the semiconductor devices described here, such as semiconductor device 200 or 300, but comprises cover layer 470 having undercut cover 473. In some examples, as shown in FIG. 7, undercut cover 473 of cover layer 470 can cover a portion of the angled or angular ledge of undercut 361.

Figure 8C:
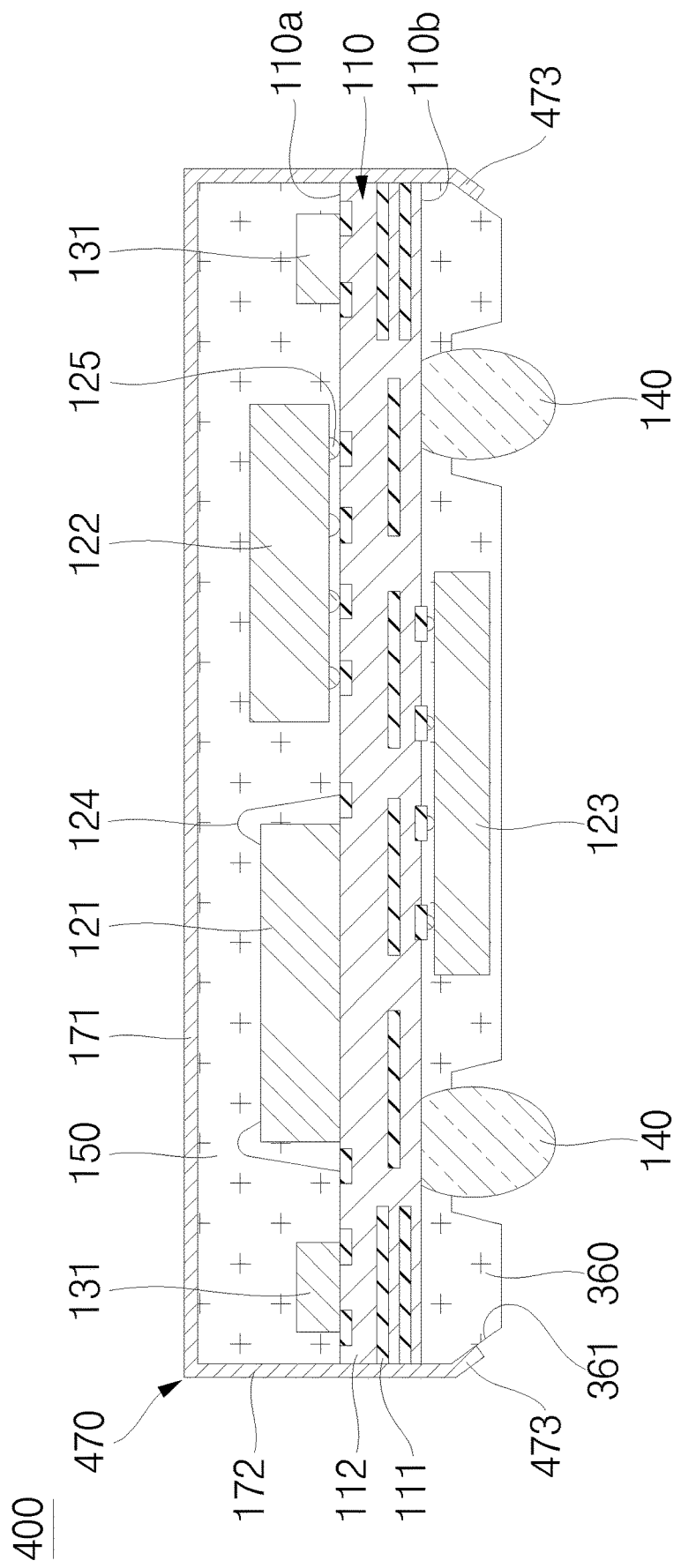

FIGS. 8A to 8C show cross-sectional views of an example method for manufacturing an example semiconductor device such as semiconductor device 400. FIG. 8A shows a cross sectional view of an early stage of manufacture for semiconductor device 400. The example and elements of FIG. 8A can be similar to those described above with respect to FIG. 6A. For instance, semiconductor devices 300 also comprise encapsulant 360 with undercut 361 and its inclined main surface. Carrier 40 can comprise an adhesive, and semiconductor devices 400 can be attached to the adhesive of carrier 40. Carrier 40 can be similar or the same as carrier 30, but when semiconductor devices 400 are attached, the fillet of the adhesive of carrier 40 can leave a majority or substantially all of the inclined main surface of undercut 361 uncovered, and in some examples the fillet can be absent.

In the example shown in FIGS. 8B-8C, cover layer 470 can be formed or provided over semiconductor devices 400, and semiconductor device 400 can then be separated from carrier 40. Cover layer 470 can be similar to cover layer 170 or 270 described above but comprises undercut cover 473 that covers undercut 361 exposed by the adhesive of carrier 20. Cover layer 470 also comprises carrier cover 473a, similar to carrier cover 172a but having an interface with undercut cover 473 rather than with side cover 172. In some examples such interface can be diagonal. In some examples, when carrier cover 473a and undercut cover 473 are separated while semiconductor device 400 is removed from carrier 40, such interface can provide benefits similar to those described above for achieving consistent breakage or separation. When semiconductor device 400 is removed from carrier 40, undercut cover 473 can remain covering a portion of undercut 361, wherein the covered portion of undercut 361 can comprise a part, a majority, or substantially all of the inclined main surface of undercut 361.

Figure 9:
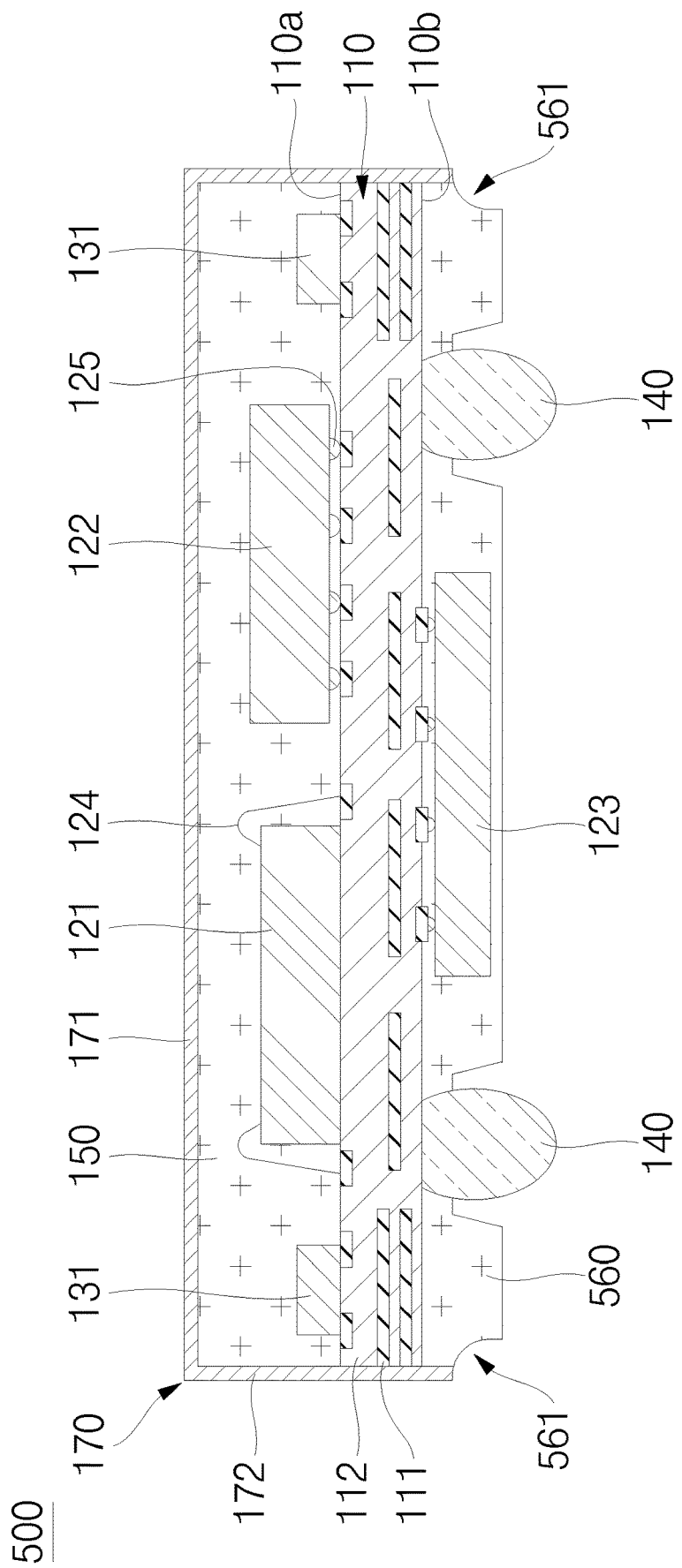
FIG. 9 shows a cross-sectional view of an example semiconductor device.

FIG. 9 shows a cross-sectional view of an example semiconductor device 500. Semiconductor device 500 can be similar to any other of the semiconductor devices described here but comprises cover layer 470 encapsulant 560 having undercut 561 with curved or concave surface.

In some examples, semiconductor device 500 can be manufactured by forming undercuts 561 using etching or lasering to define the concave surface. In some examples, the concave surface of undercut 561 can extend through a majority of a thickness of encapsulant 560, and there can be examples where undercut 561 can extend through an entire thickness of encapsulant 560. In some examples, side cover 172 of cover layer 170 can cover the side surface of encapsulant 560 above undercut 561 similar to as described above for FIGS. 1-2 and FIGS. 5-6 with respect to the sidewall of encapsulant 160 or 360 covered by side cover 172. In some examples, cover layer 170 can comprise an undercut cover, similar to undercut cover 273 or 473 described above for FIGS. 3-4 and FIGS. 7-8 that covers a portion of undercut 561.

Figure 10:
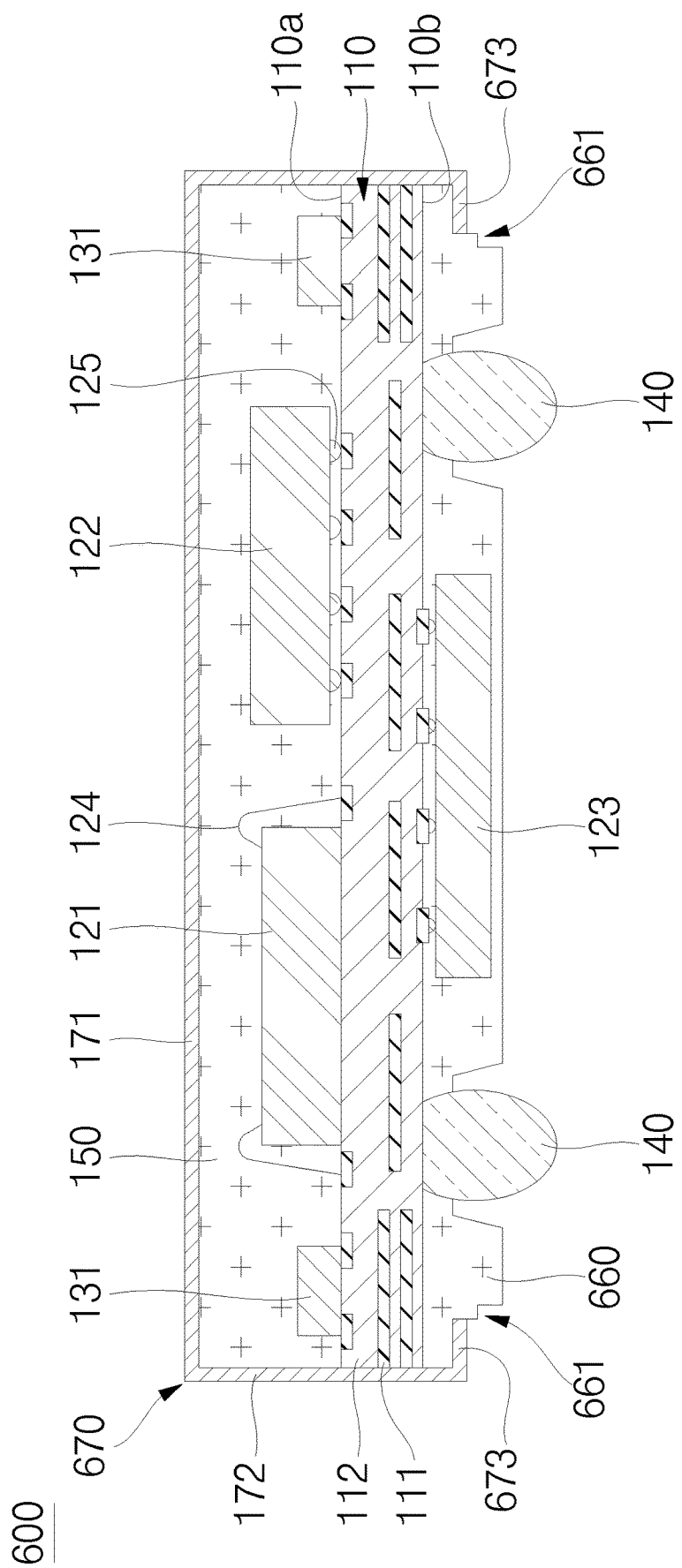
FIG. 10 shows a cross-sectional view of an example semiconductor device.

FIG. 10 shows a cross-sectional view of an example semiconductor device 600. Semiconductor device 600 can be similar to any other of the semiconductor devices described here, such as semiconductor device 100, but comprises encapsulant 660 having undercut 661 and undercut cover 673. In some examples, undercut 661 can comprise multiple ledges such as shown in FIG. 10. In some examples, undercut cover 673 can cover a portion of one or more of the ledges, and can leave a portion of a second ledge uncovered.

Figure 11C:
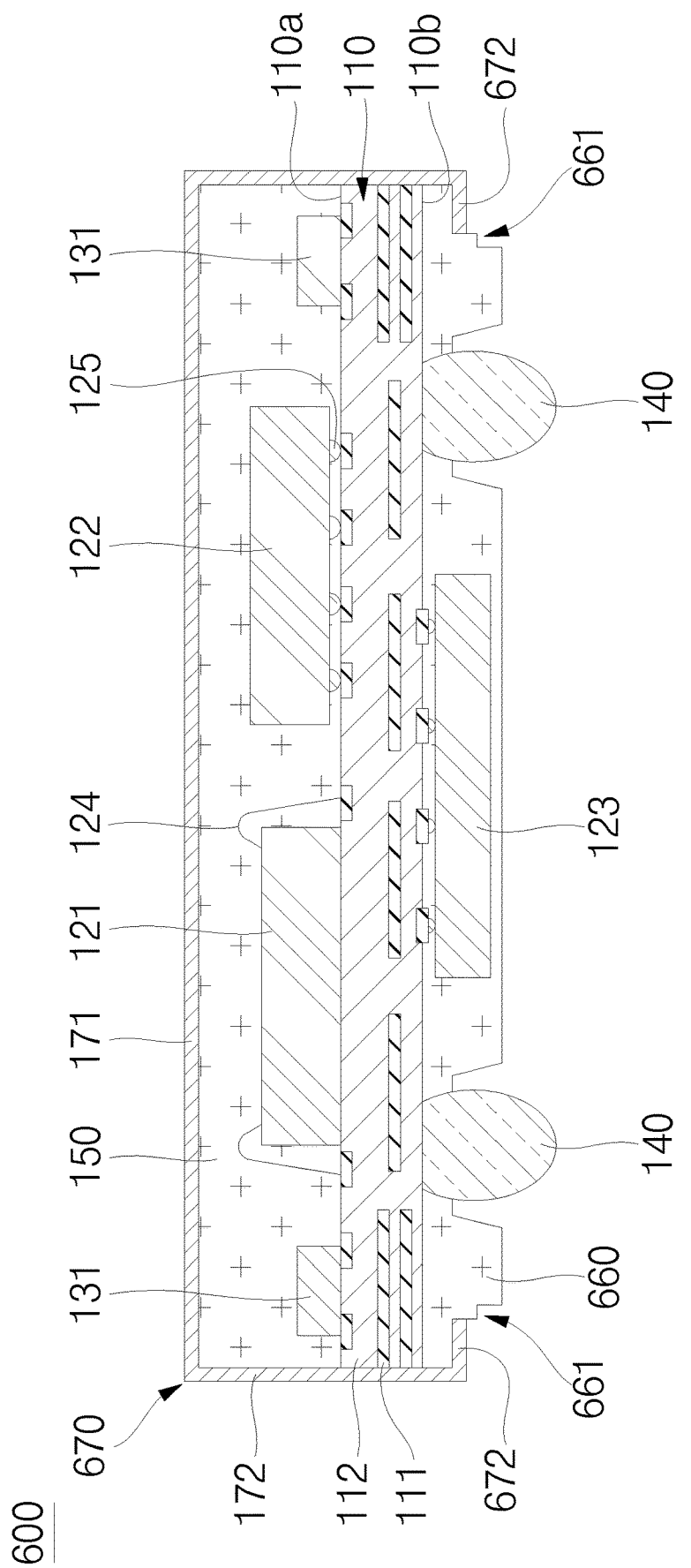

FIGS. 11A to 11C show cross-sectional views of an example method for manufacturing an example semiconductor device such as semiconductor device 600. FIG. 11A shows a cross sectional view of an early stage of manufacture for semiconductor device 600. The example and elements of FIG. 11A can be similar to those described above with respect to FIG. 4A. Undercut 661 can comprise multiple ledges having respective bottom facing surfaces at different heights from bottom surface 110b of substrate 110. Undercut 661 can comprise one of such ledges, such as the upper ledge of undercut 661. In some examples the ledges of undercut 661 can be formed or provided sequentially, with each ledge of undercut 661 formed or provided by a step of etching, lasering, or sawing. In the present example, carrier 50 can comprise an adhesive, and semiconductor devices 600 can be attached to the adhesive of carrier 50. Carrier 50 can be similar or the same as carrier 10, but when semiconductor devices 600 are attached, the fillet 51 of the adhesive of carrier 50 does not fully fill undercut 661 and instead leaves the ledge of undercut exposed. Other ledges of undercut 661, however, can be covered by the adhesive.

In the example shown in FIGS. 11B-11C, cover layer 670 can be formed or provided over semiconductor devices 600. Cover layer 670 can be similar to cover layer 270 described above and comprises undercut cover 673 that covers undercut 661 exposed by the adhesive of carrier 50. When semiconductor device 600 is separated from carrier 50, undercut cover 673 of cover layer 670 remains attached to undercut 661 but other ledges of undercut 661 can remain exposed from cover layer 670.

The present disclosure includes reference to certain examples. It will be understood, however, by those skilled in the art that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:
a substrate having a top side and a bottom side;
an electronic device on the top side of the substrate;
a first encapsulant on the top side of the substrate contacting a side of the electronic device;
a second encapsulant on the bottom side of the substrate, wherein the second encapsulant includes an undercut at an end of the second encapsulant, wherein the undercut extends from a lateral side of the second encapsulant to a bottom side of the second encapsulant; and
a cover layer comprising a top cover on a top side of the first encapsulant and a side cover on a side of the first encapsulant and a side of the substrate, wherein the side cover extends adjacent to the undercut.

2. The semiconductor device of claim 1, wherein the undercut comprises a horizontal ledge that is parallel with a bottom surface of the substrate.

3. The semiconductor device of claim 2, wherein the cover layer comprises an undercut cover that covers a portion of the horizontal ledge.

4. The semiconductor device of claim 1, wherein the undercut comprises an angular ledge that is slanted with respect to a bottom surface of the substrate the substrate.

5. The semiconductor device of claim 4, wherein the angular ledge is at an acute angle with respect to a bottom surface of the substrate.

6. The semiconductor device of claim 4, wherein the cover layer comprises an undercut cover that covers a portion of the angular ledge.

7. The semiconductor device of claim 1, wherein the undercut comprises a curved surface.

8. The semiconductor device of claim 7, wherein the curved surface is concave.

9. The semiconductor device of claim 1, wherein the undercut comprises multiple ledges.

10. The semiconductor device of claim 9, wherein the cover layer comprises an undercut cover that covers a portion of one of the multiple ledges and leaves a portion of a second one of the multiple ledges uncovered.

11. The semiconductor device of claim 1, further comprising an additional electronic device on the bottom side of the substrate, wherein the second encapsulant contacts a side of the additional electronic device.

12. A method to manufacture a semiconductor device, comprising:
providing a substrate having a top side and a bottom side;
providing a first electronic device on the top side of the substrate and a second electronic device on the bottom side of the substrate;
providing a first encapsulant on the top side of the substrate contacting a side of the first electronic device, and a second encapsulant on the bottom side of the substrate contacting a side of the second electronic device;
providing an undercut at an end of the second encapsulant, wherein the undercut extends from a lateral side of the second encapsulant to a bottom side of the second encapsulant;
attaching a carrier to the bottom side of the second encapsulant;
providing a cover layer on a top side of the first encapsulant, on a side of the first encapsulant, on a side of the substrate, and on a portion of the carrier; and
removing the carrier and a portion of the cover layer on the portion of the carrier, wherein the cover layer remains adjacent to the undercut after the removing.

13. The method of 12, wherein said attaching the carrier includes providing a fillet that extends into and at least partially covers the undercut, wherein the cover layer covers the fillet.

14. The method of claim 13, wherein the fillet is outwardly slanted adjacent the undercut.

15. The method of claim 12, wherein the cover layer covers a vertical sidewall of the second encapsulant between the undercut and the substrate.

16. The method of claim 13, wherein the fillet fully covers the undercut.

17. A semiconductor device, comprising:
a substrate having a top side and a bottom side;
an electronic device on the top side of the substrate;
a first encapsulant portion on the top side of the substrate and a second encapsulant portion on the bottom side of the substrate, wherein the first encapsulant portion contacts a side of the electronic device;
an undercut in the second encapsulant portion, wherein the undercut extends from a lateral side of the second encapsulant portion to the bottom side of the second encapsulant portion; and
a shield on a top side of the first encapsulant portion, on a lateral side of the second encapsulant portion, and extending adjacent to the undercut.

18. The semiconductor device of claim 17, wherein an end of the shield covers a portion of the undercut.

19. The semiconductor device of claim 17, wherein part of the second encapsulant portion is between the substrate and the undercut.

20. The semiconductor device of claim 17, further comprising an additional electronic device on the bottom side of the substrate, wherein the second encapsulant portion contacts a side of the additional electronic device.

* * * * *